United States Patent [19]

Lee

[11] Patent Number: 5,693,554
[45] Date of Patent: Dec. 2, 1997

[54] FABRICATION METHOD FOR CAPACITOR OF STACK-TYPE DRAM CELL

[75] Inventor: Sang-Don Lee, Choongcheongbuk-Do, Rep. of Korea

[73] Assignee: LG Semicon Co., Ltd., Cheongju, Rep. of Korea

[21] Appl. No.: 772,983

[22] Filed: Dec. 23, 1996

[30] Foreign Application Priority Data

Dec. 28, 1995 [KR] Rep. of Korea ............. 62052/1995

[51] Int. Cl.$^6$ ............................................. H01L 21/8242
[52] U.S. Cl. ............................ 437/52; 437/60; 437/919
[58] Field of Search ................................. 437/47, 52, 60, 437/919

[56] References Cited

U.S. PATENT DOCUMENTS

| | | | |
|---|---|---|---|
| 5,443,993 | 8/1995 | Park et al. | 437/52 |
| 5,447,878 | 9/1995 | Park et al. | 437/52 |
| 5,516,719 | 5/1996 | Ryou | 437/60 |

OTHER PUBLICATIONS

Watanabe, H., et al., "A New Cylindrical Capacitor Using Hemispherical Grained Si (HSG–Si) for 256Mb DRAMs," 260–IDEM '92, pp. 259–262.

*Primary Examiner*—Jey Tsai
*Attorney, Agent, or Firm*—Fleshner & Kim

[57] ABSTRACT

A fabrication method for a capacitor of a stack-type DRAM cell includes forming a first insulating film, an anti-etching film, and a first conductive film on a substrate by which a switching transistor and a bit line previously are buried, forming a patterned second insulating film on the first conductive film, forming a second conductive film on the first conductive film having the patterned second insulating film thereon, dry-etching the first and second conductive film to expose a portion of the surface of the anti-etching film therethrough, forming a contact hole by etching the exposed surface of the anti-etching film and the first insulating film therebeneath, forming a third conductive film over the surfaces of the first and the second conductive films, including the contact hole therebetween, forming a planarized fourth insulating film over the third conductive film, etching the fourth insulating film to expose a portion of the surface of the anti-etching film above the bit line and then etching the third and the first conductive films, forming sidewalls composed of a fourth conductive film and forming a node electrode composed of the first through fourth conductive films.

11 Claims, 5 Drawing Sheets

FABRICATION METHOD FOR CAPACITOR OF STACK-TYPE DRAM CELL

BACKGROUND OF THE INVENTION

1. Field of the Invention

The present invention relates to a fabrication method for a capacitor of a stack-type DRAM cell, and in particular to an improved fabrication method for a capacitor of a stack-type DRAM cell in which the contacting of capacitors of a memory cell allows self-alignment of the capacitors, resulting in sufficient overlaying margin and increased capacitance.

2. Description of the Conventional Art

As the memory cell area is decreased more and more by the high integration tendency of semiconductor devices, a high density DRAM ultra-large scale integrated circuit (ULSI) is being demanded. This causes a reduction in the capacitor area, resulting in a decrease in the cell capacitance.

Taking a 256 Mb DRAM for example, although a stack-type capacitor having a simple construction employs, as an insulation film, $Ta_2O_5$ which is a high dielectric film, it is incapable of providing a sufficient capacitance. To solve this problem, an expansion of the surface region of a storage electrode is suggested as the best solution.

Accordingly, recently in order to minimize the area which a capacitor occupies, and to maximize the actual surface area of a capacitor, there has been developed a technique for fabricating a storage node electrode having an uneven surface.

There have been developed many processes for forming an uneven surface silicon storage node electrode called a hemispherical-grained-Si (HSG), which include using low-pressure chemical-vapor deposition (LPCVD) at a transition temperature of amorphous-Si or polycrystalline-Si, using an ultra-high-vacuum annealing on an amorphous-Si which is native-oxide-free, and using a seeding.

FIGS. 1A through 1F show a fabrication method for a capacitor of a stack-type DRAM memory cell having an HSG-Si cylindrical construction, which is designed so that the effective area of the capacitor can be maximized without increasing the memory cell area. The fabrication process will now be described with reference to FIGS. 1A through 1F.

A first step, as shown in FIG. 1A, includes forming a CVD nitride film 12 formed on an insulating substrate composed of an oxide film 10/a silicon substrate S, and then forming a contact hole by etching the CVD nitride film 12 and the oxide film 10 using a junction mask so that a portion of the silicon substrate S is exposed, and finally filling a first n+ polycrystalline-Si film 14 in the contact hole.

A second step, as shown in FIG. 1B, includes depositing a second n+ polycrystalline-Si film 14' on a predetermined portion of the CVD nitride film 12 surrounding the first n+ polycrystalline-Si 14, and depositing a CVD oxide film (for example, BPSG or PSG) 16 on the second n+ polycrystalline-Si 14', and forming a planar node electrode composed of the n+ polycrystalline-Si film structure 14 and the second n+ polycrystalline-Si film 14' by etching, using a mask, the second n+ polycrystalline-Si film 14' and the CVD oxide film 16 so that a predetermined portion of the surface of the CVD nitride film 12 is exposed.

A third step, as shown in FIG. 1C, includes depositing a third n+ polycrystalline-Si film 14'' on the resultant structure and the CVD nitride film 12 and forming a vertical node electrode by a dry-etching method.

A fourth step, as shown in FIG. 1D, includes stripping the CVD oxide film 16 by a wet-etching method, and, as shown in FIG. 1E, by a seeding, depositing an HSG-Si film 18 on the surface of the second and third n+ polycrystalline-Si films 14' and 14'' which are used respectively as a planar node electrode and a vertical node electrode in order to increase the capacity of the capacitor, and finally forming a high dielectric thin film (for example, NO thin film, $Ta_2O_5$ thin film, $BaSrTiO_3$) on the HSG-Si film surface as an insulating film 20.

A fifth step, as shown in FIG. 1F, which is a final step in fabricating the capacitor of the memory cell, includes depositing on the insulating film 20 a fourth n+ polycrystalline-Si film 14'''' which is to be used as a plate electrode.

FIG. 2 is a cross-sectional diagram of a DRAM cell showing a construction of a cell transistor and a cell capacitor completed by using the above-described steps when fabricating a capacitor.

In the cross-sectional diagram, S denotes a p-type substrate, reference numeral 1 denotes a field oxide film, 2 a gate insulating film, 3 a gate, 4 a junction diffused region, 10 first and second oxide films, 6 a bit line, 14 and 15 first and second storage node electrodes of a cell capacitor, respectively, 20 an insulating film, and reference numeral 14'' denotes a plate electrode of the cell capacitor.

In this construction, the capacitance (C) of the cell capacitor can be represented in terms of the surface area A of the contacting surfaces of the node electrodes 14,15 and the plate electrode 14'' as follows;

$$C \propto (\Sigma_1/d_1)*A$$

Here, $d_1$ represents the thickness of the insulating film of the cell capacitor, and $\Sigma_1$ represents a dielectric constant of the insulating film of a cell capacitor.

Therefore, to increase the capacitance of the cell capacitor, the thickness $d_1$ of an insulating film of a cell capacitor must be decreased, the dielectric constant $\Sigma_1$ be increased and the surface area A be increased. When the values of $d_1$ and $\Sigma_1$ are constant, C is increased depending on the surface area A.

But, the junction of a capacitor of a DRAM memory cell fabricated by the above processes is formed through an etching process of the oxide film 10 using a junction mask. Therefore, when the cell area is decreased below 0.1 $\mu m^2$ due to the high integration of the semiconductor device, there occurs the disadvantage that an overlay margin cannot be afforded and an increase in the capacitance of the cell capacitor encounters a limit.

SUMMARY OF THE INVENTION

Accordingly, it is an object of the present invention to provide a fabrication method for a capacitor of a stack-type DRAM memory cell which is appropriate for the fabrication of a memory cell having a small area and is capable of improving the DRAM cell capacitance.

To achieve the above object, there is provided a fabrication method for a capacitor of a stack-type DRAM memory cell according to the present invention which includes forming a first insulating film, an anti-etching film, and a first conductive film on a substrate by which a switching transistor and a bit line formed previously are buried, forming a patterned second insulating film on a first conductive film in such a manner that patterned portions of the second insulating film are formed having a predetermined spacing therebetween, forming a second conductive film on the first conductive film and the patterned second insulating film thereon, dry-etching the first and second conductive film to expose a portion of the surface of the anti-etching film therethrough, forming a contact hole by etching the exposed surface of the anti-etching film and the first insulating film therebeneath, forming a third conductive film over the surfaces of the first and the second conductive films, including the contact hole therebetween, forming a planarized fourth insulating film over the third conductive film, etching the fourth insulating film to expose portion of the surface of the anti-etching film above the bit line and then etching the third and the first conductive films, forming sidewalls composed of a fourth conductive film at sides of the fourth insulating film, the third and first conductive films and forming a node electrode composed of the first through fourth conductive films, stripping the fourth insulating film, forming a dielectric film over the surfaces of the node electrode and the anti-etching film, and forming a plate electrode over the dielectric film.

As a result of the above-mentioned processes, the capacitance of a DRAM cell can be increased and at the same time an overlay margin among the underlying patterns can be improved.

BRIEF DESCRIPTIONS OF THE DRAWINGS

The present invention will become more fully understood from the detailed description given hereinbelow and the accompanying drawings which are given by way of illustration only, and thus are not limitative of the present invention, and wherein;

FIG. 3A through 3D, 3E1, 3E2 and 3F are views showing a fabrication method for a capacitor of a stack-type DRAM memory cell according to the present invention.

DETAILED DESCRIPTION OF THE PREFERRED EMBODIMENTS

FIGS. 3A through 3F illustrate the fabrication method for a capacitor of a DRAM memory cell according to the present invention, as will now be explained in more detail with reference to these drawings.

Figure 3A:
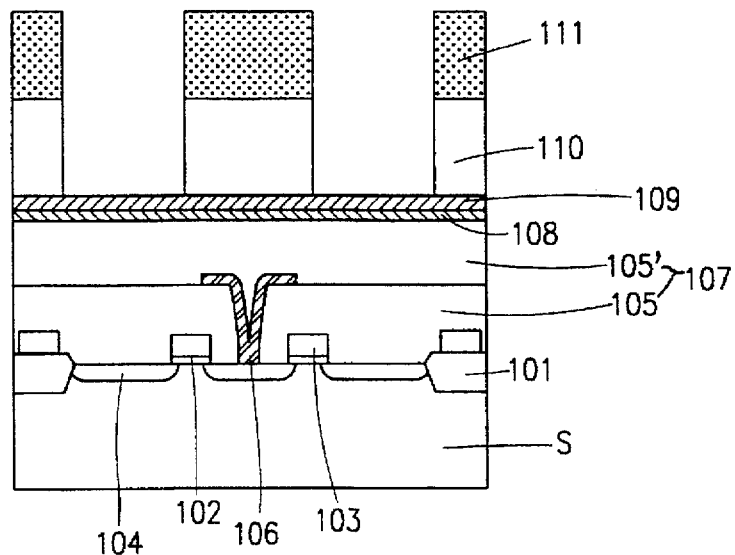

As shown in FIG. 3A, a first step includes defining an active region by growing a field oxide film 101 on a substrate S, forming a gate insulating film 102 and a gate 103 which are composing elements of a memory cell at the active region, and then performing an ion implantation of an impurity using the gate insulating film 102 and the gate 103 as a mask, and finally forming a switching transistor by forming in the substrate, source/drain regions which are junction diffusion regions 104.

On the structure resulting from the above-described step, a first CVD insulation oxide film 105 is formed, and the first CVD oxide film 105 is etched to expose a predetermined portion of the surface of the substrate S, and finally a bit line 106 is filled in the etched region so that the bit line 106 connects the drain region of each switching transistor, respectively.

Next, a second CVD insulating oxide film 105' is formed on the first CVD oxide film 105 by which the bit line 106 is buried, and a CVD nitride film which is to serve as an anti-etching film 108 and a first conductive film 109 of polycrystalline-Si are deposited in turn onto the second CVD oxide film 105'. Here, the first and second oxide films 105 and 105' are in combination referred to as a first insulating film 107 for the sake of convenience.

Then, a second insulating film (for example, a CVD oxide film, a CVD nitride film, PSG, BPSG or USG) 110 is deposited on the first conductive film 109, and a photoresist film pattern 111 which serves as a junction mask is formed thereon. Then the second insulating film 110 is selectively etched using the photoresist film pattern 111. Here, the first conductive film 109 is formed to be 100Å to 1000Å thick, and the second insulation film 110 is formed to be 500Å to 10000Å thick.

Figure 3B:
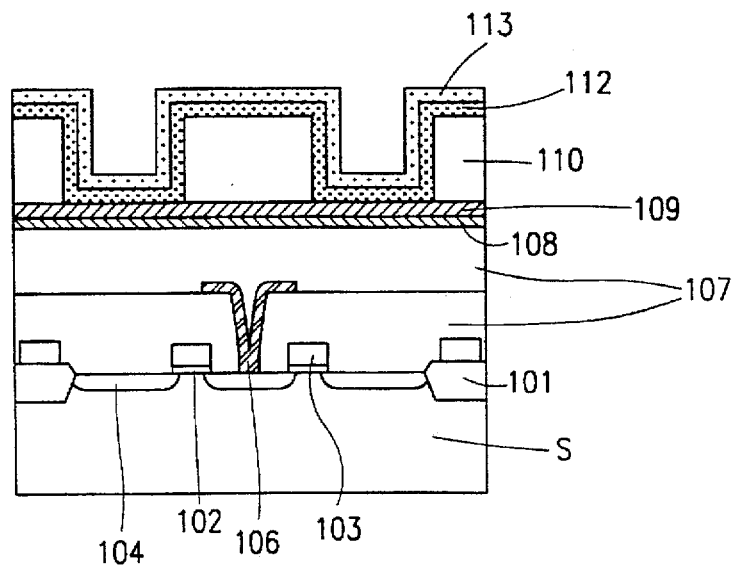

As shown in FIG. 3B, the next step includes stripping the photoresist film pattern 111, and continuously depositing a second conductive film 112 (that is, polycrystalline-Si) having a thickness of 200 to 1000Å and a third insulating film 113 (that is, a CVD oxide film or a CVD nitride film) having a thickness of 100 to 1000Å over the entire surface of the first conductive film 109 and the patterned second insulating film thereon and around the second insulating film in consideration of an overlay margin of the memory cell junction.

Figure 3C:
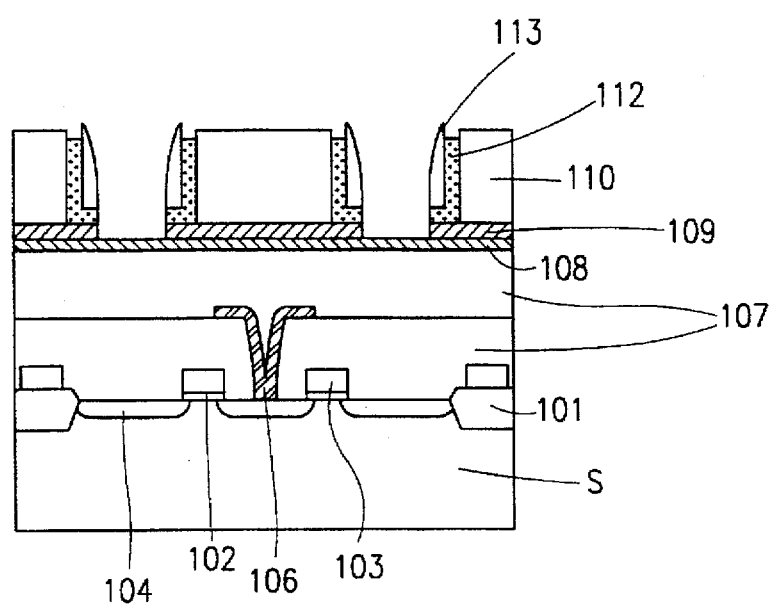

As shown in FIG. 3C, the next step includes dry-etching the third insulating film 113 and the second and the first conductive films 112 and 109 so that predetermined portions of the surface of the anti-etching film 108 are exposed having a predetermined distance therebetween and forming sidewall patterns at each side composed of the second conductive film 112 and the third insulating film 113. Here, there can be slight changes in the order of the above step; for example, not using the third insulating film 113 in the step in FIG. 3B, so that after only the second conductive film 112 is deposited, the second and the first conductive films 112 and 109 are etched and then a sidewall pattern is formed at each side of the second conductive film.

Figure 3D:
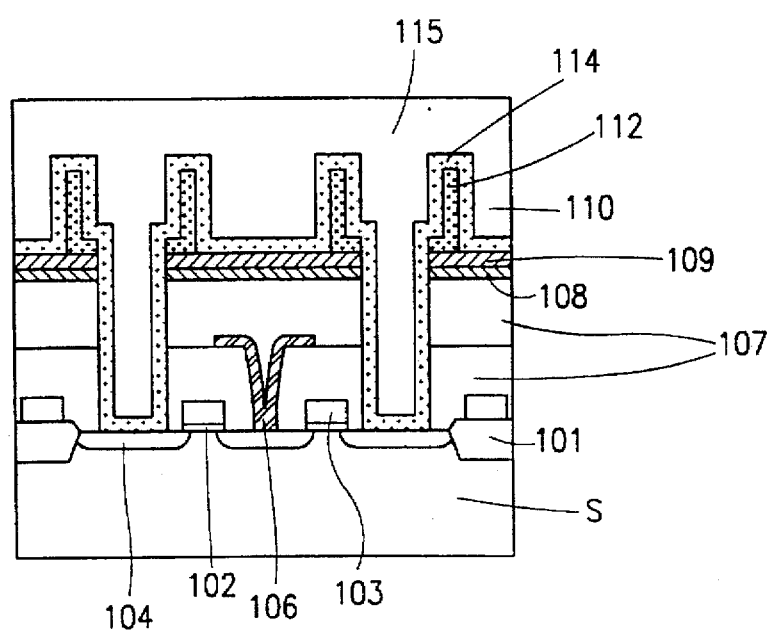

As shown in FIG. 3D, the next step includes etching the exposed surface of the anti-etching film 108 and the first insulating film 107 located therebeneath, using the pattern formed in FIG. 3C as a mask. During this step, since the second and the third insulating films 110 and 113 are etched together, a contact hole is formed in such a manner that the surface of the second conductive film 112 is exposed on the top layer and the source region of the transistor is exposed.

In the above method, when an etching step is carried out using as a mask the sidewall pattern at each side which is composed of the second conductive film 112 having the third insulating film 113, a required overlay margin among the underlying patterns is secured.

Then in sequence, a third conductive film 114 (that is, polycrystalline-Si) is formed to be 200 to 2000Å thick along the entire surface of the contact hole and the first and the second conductive films 109 and 112, and the top surface is planarized by depositing a fourth insulation film 115 thereon. Here the fourth insulating film 115 is formed to be 2000 to 6000Å thick upwardly from the exposed surface of the anti-etching film 108.

Figures 1, 3E:
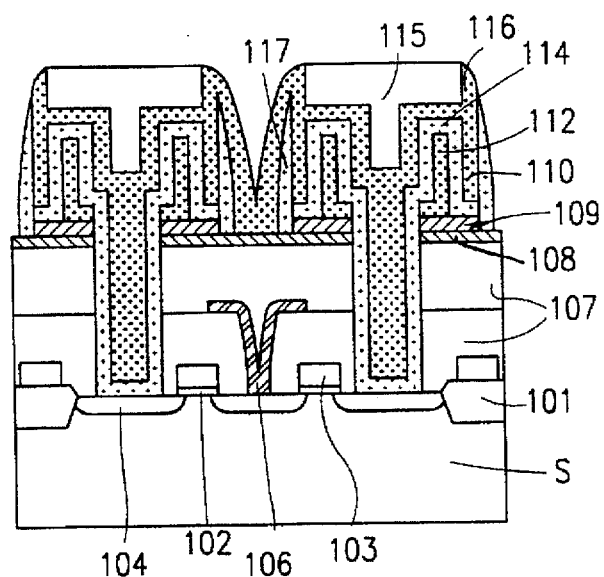
Figures 2, 3E:
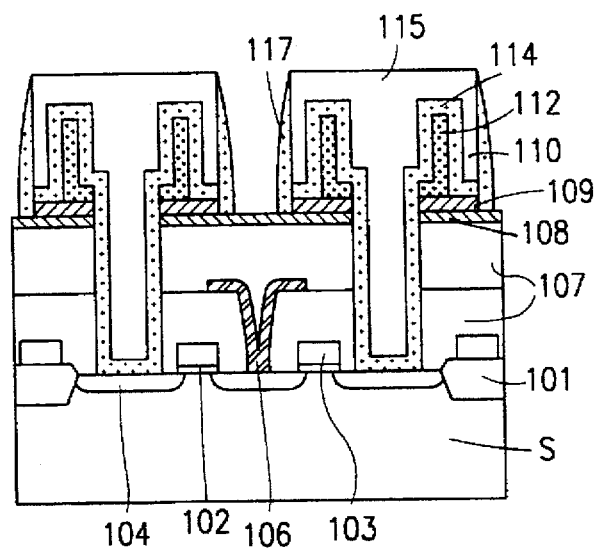

As shown in FIG. 3E-1, after a photoresist film pattern to be used as a mask for forming a node is formed on the fourth insulating film 115, the fourth insulating film 115 therebeneath is etched using the photoresist film pattern as a mask, and then the photoresist film is stripped. Again, after a fifth insulating film 116 having a thickness of 200 to 1000Å is deposited over the entire surface of the resulting structure, a planar node electrode is formed which is composed of the first to third conductive films 109, 112, and 114 by dry-etching the fifth insulating film 116 and the third and the first conductive films 114 and 109. During the above step, a portion of the surface of the anti-etching film 108 located over the bit line 106 is exposed and portions of the fifth insulating film 116 in the shape of sidewalls are left at each side of the fourth insulating film 115.

Next, a thin fourth conductive film 117 (that is, polycrystalline-Si) is deposited over the entire exposed surface of the anti-etching film and the fourth and fifth insulating films 115 and 116 and the first and the third conductive films 109 and 114 thereon, and then by dry-etching the thin fourth conductive film 117, a vertical node electrode is formed.

Figure 1A:
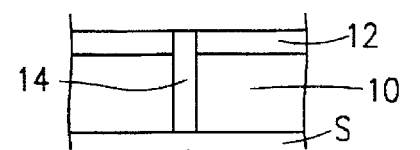
FIGS. 1A through 1F are views showing a fabrication method for a capacitor of a stack-type DRAM memory cell according to the conventional art.
Figure 1B:
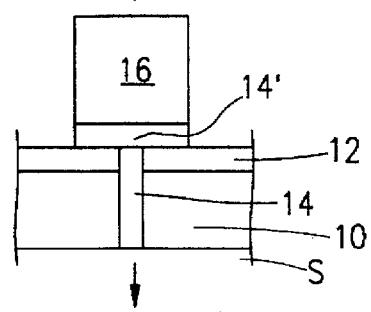
Figure 1C:
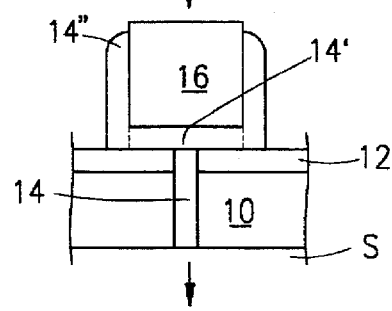
Figure 1D:
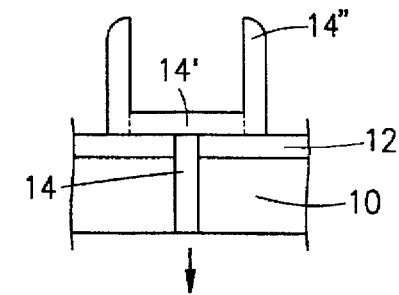
Figure 1E:
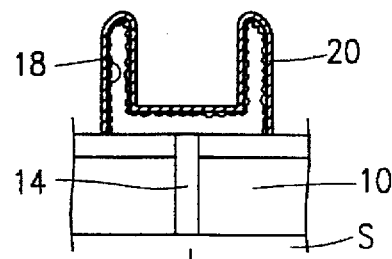
Figure 1F:
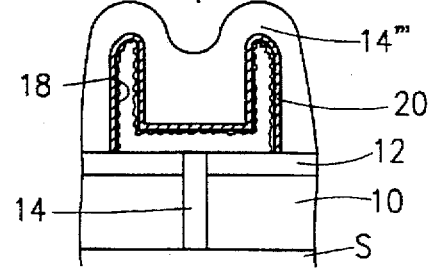
Figure 2:
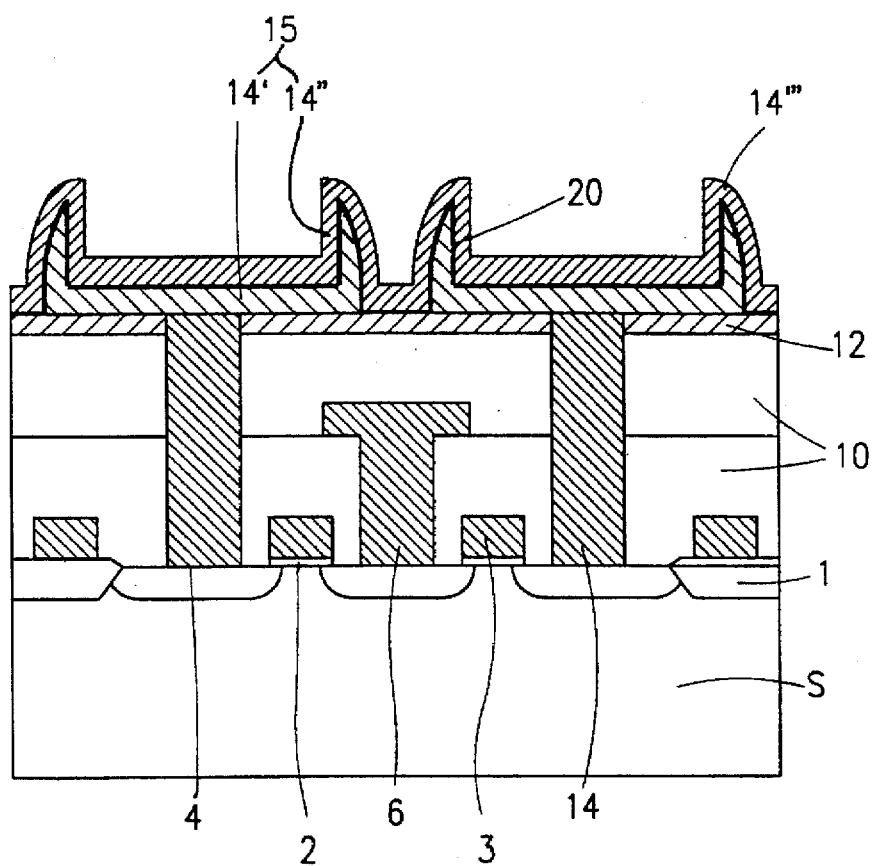
FIG. 2 is a cross-sectional diagram showing a construction of a stack-type DRAM memory cell fabricated by the steps in FIGS. 1A through 1F.

However, there can be a slight change in the order of the above steps. As shown in FIG. 3E-2, the fabrication may include forming a photoresist film pattern on the fourth insulating film, and etching the fourth insulating film 115 therebeneath and the third and the first conductive films 114 and 109 using the photoresist film pattern as a mask, then stripping the photoresist film pattern, forming a planar node electrode composed of the first through the third conductive films 109, 112 and 114, then depositing the thin fourth conductive film 117 (that is, polycrystalline-Si) over the entire exposed surface of the anti-etching film 108 having thereon the fourth insulating film 115 and the third and the first conductive film 114 and 109 without a deposition of the fifth insulating film 116 (which is a different step from those shown in FIG. 3E-1, and then by dry-etching the fourth conductive film 117, a vertical node electrode is formed having the sidewall-shaped fourth conductive film at the sides of the fourth insulating film 115 and the third and the first conductive films 114 and 109.

Figure 3F:
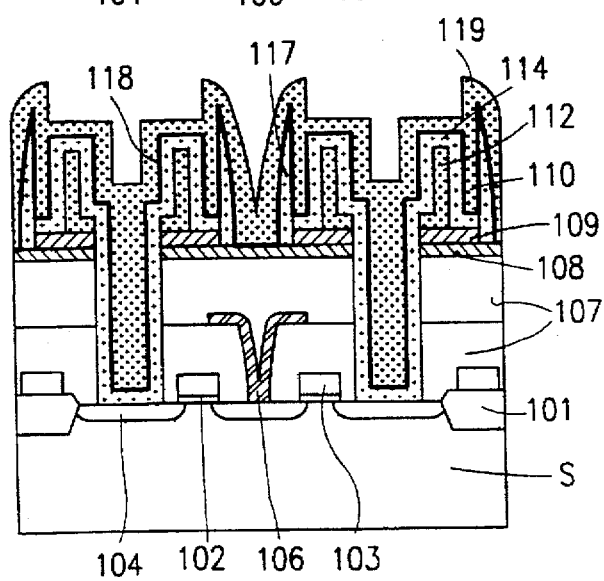

As shown in FIG. 3F, the next step includes stripping the fourth insulating film 115 and the fifth insulating film 116 by wet-etching. Then, a thin high dielectric film (for example, NO (Nitride-Oxide), $Ta_2O_5$ or $BaSrTiO_3$) is formed around the surface of the node electrode and the anti-etching film 108, and finally a plate electrode is formed by depositing a fifth conductive film (that is, polycrystalline-Si) around the dielectric film 118 to complete the fabrication of the memory cell capacitor.

When a capacitor is fabricated according to the above-mentioned process, because the sidewall conductive film pattern itself is used as the node electrode, the surface area of the memory cell capacitor is much increased compared with the conventional memory cell capacitor, resulting in an increase in the capacitance of the capacitor.

Furthermore, when the steps shown in either FIGS. 3E-1 or 3E-2 are performed, another technique for increasing the capacitance of the capacitor includes stripping the fourth and the fifth insulating film 115 and 116 by wet-etching, and then depositing HSG-Si around the surface of a node electrode composed of the first through the fourth conductive films 109, 112, 114 and 117, and, after depositing a thin high dielectric film 118 thereon, depositing the fifth conductive film 119 around the dielectric film 118 and finally forming the plate electrode.

As described in detail above, according to the present invention, since the etching process using a junction mask for the memory cell is performed irrespective of the overlay margin which depends on the process apparatus, it is possible to fabricate a memory cell having a cell area below 1.0 $\mu m^2$, and to embody a desired DRAM device which is capable of and increasing the capacitance of a memory cell capacitor.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed:

1. A fabrication method for a capacitor of a stacked DRAM cell comprising:

forming a first insulating film, an anti-etching film, and a first conductive film on a substrate by which a switching transistor and a bit line formed previously are buried;

forming a patterned second insulating film on a first conductive film in such a manner that patterned portions of the second insulating film are formed having a predetermined spacing therebetween;

forming a second conductive film on the first conductive film and the patterned second insulating film thereon;

dry-etching the first and second conductive films to expose a portion of the surface of the anti-etching film therethrough;

forming a contact hole by etching the exposed surface of the anti-etching film and the first insulating film therebeneath;

forming a third conductive film over the surfaces of the first and the second conductive films, including the contact hole therebetween;

forming a planarized fourth insulating film over the third conductive film;

etching the fourth insulating film to expose portion of the surface of the anti-etching film above the bit line and then etching the third and the first conductive films;

forming sidewalls composed of a fourth conductive film at sides of the fourth insulating film, the third and first conductive films and forming a node electrode composed of the first through fourth conductive films;

stripping the fourth insulating film, forming a dielectric film over the surfaces of the node electrode and the anti-etching film; and forming a plate electrode over the dielectric film.

2. The fabrication method of claim 1, wherein said first conductive film is formed to be 100Å to 1000Å thick.

3. The fabrication method of claim 1, wherein said second insulating film is composed of one of a CVD nitride film, a nitride film, PSG, BPSG, and USG.

4. The fabrication method of claim 1, wherein said second conductive film is formed on the first conductive film having the second insulating film thereon, and then a third insulating film is deposited on the second conductive film and then is wet-etched.

5. The fabrication method of claim 4, wherein said third insulating film is composed of one of a CVD oxide film or nitride film.

6. The fabrication method of claim 1, wherein said second conductive film is formed to be 200 to 1000Å thick.

7. The fabrication method of claim 1, wherein said third conductive film is formed to be 200 to 1000Å.

8. The fabrication method of claim 1, wherein said fourth insulating film is formed to be 2000 to 6000Å upwards from the surface of the anti-etching film.

9. The fabrication method of claim 1, wherein when the exposed surface of the anti-etching film and the first insulating film therebeneath are etched to form the contact hole, the second insulating film is etched together therewith.

10. The fabrication method of claim 1, wherein said fourth insulating film is etched in such a manner that a portion of the surface of the anti-etching film above the bit line is exposed and then a fifth insulating film is deposited over the entire surface of the resulting structure, and is wet-etched.

11. The fabrication method of claim 1, wherein after said node electrode is formed HSG-Si is deposited thereon.

* * * * *